US011239278B2

(12) United States Patent
Yang et al.

(10) Patent No.: US 11,239,278 B2
(45) Date of Patent: Feb. 1, 2022

(54) BOTTOM CONDUCTIVE STRUCTURE WITH A LIMITED TOP CONTACT AREA

(71) Applicant: International Business Machines Corporation, Armonk, NY (US)

(72) Inventors: Chih-Chao Yang, Glenmont, NY (US); Baozhen Li, South Burlington, VT (US); Theodorus E. Standaert, Clifton Park, NY (US); Koichi Motoyama, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 16/781,716

(22) Filed: Feb. 4, 2020

(65) Prior Publication Data

US 2021/0242278 A1 Aug. 5, 2021

(51) Int. Cl.
*H01L 27/22* (2006.01)
*H01L 45/00* (2006.01)
*G11C 11/16* (2006.01)
*H01L 43/08* (2006.01)
*H01L 43/12* (2006.01)

(52) U.S. Cl.
CPC .......... *H01L 27/222* (2013.01); *G11C 11/161* (2013.01); *H01L 43/08* (2013.01); *H01L 43/12* (2013.01); *H01L 45/124* (2013.01); *H01L 45/145* (2013.01); *H01L 45/1608* (2013.01); *H01L 45/1691* (2013.01)

(58) Field of Classification Search
CPC ....... H01L 27/222; H01L 43/08; H01L 43/12; H01L 45/124; H01L 45/145; H01L 45/1608; H01L 45/1691; G11C 11/161

USPC .......................................................... 257/421
See application file for complete search history.

(56) References Cited

U.S. PATENT DOCUMENTS

| | | |
|---|---|---|
| 5,256,274 A | 10/1993 | Poris |
| 5,368,711 A | 11/1994 | Poris |
| 6,258,709 B1 | 7/2001 | McDaniel |
| 6,352,917 B1 | 3/2002 | Gupta et al. |
| 7,173,271 B2 | 2/2007 | Chang |
| 7,205,228 B2 | 4/2007 | Padhi et al. |
| 8,188,810 B2 | 5/2012 | Fazzio et al. |
| 8,796,795 B2 | 8/2014 | Satoh et al. |
| 9,530,866 B1 | 12/2016 | Zhang et al. |
| 9,613,861 B2 | 4/2017 | Anderson et al. |
| 2009/0246557 A1* | 10/2009 | Horng .................. G11C 11/161 428/811.1 |
| 2015/0372225 A1 | 12/2015 | Gaidis et al. |
| 2016/0163587 A1 | 6/2016 | Backes et al. |
| 2017/0263553 A1 | 9/2017 | Schenker et al. |
| 2020/0106000 A1* | 4/2020 | Chiu ..................... H01L 27/222 |

* cited by examiner

*Primary Examiner* — Jami Valentine Miller
(74) *Attorney, Agent, or Firm* — Scully, Scott, Murphy & Presser, P.C.; L. Jeffrey Kelly, Esq.

(57) ABSTRACT

A dielectric spacer is formed laterally adjacent to a bottom conductive structure. The dielectric spacer is configured to limit the area in which a subsequently formed top contact structure can contact the bottom conductive structure. In some embodiments, only a topmost surface of the bottom conductive structure is contacted by the top contact structure. In other embodiments, a topmost surface and an upper sidewall surface of the bottom conductive structure is contacted by the top contact structure.

20 Claims, 8 Drawing Sheets

BOTTOM CONDUCTIVE STRUCTURE WITH A LIMITED TOP CONTACT AREA

BACKGROUND

The present application relates to interconnect and memory structures, and more particularly to interconnect and memory structures having a top contact structure that contacts a limited area of an underlying bottom conductive structure.

As metal pitch becomes smaller, and pitch lines become thinner and thinner, a subtractive metal patterning scheme, which includes deposition of a metal-containing layer and one or more subtractive etching processes, becomes attractive because no metal liner is needed and the subtractive metal patterning scheme provides huge resistance benefits. In conventional subtractive metal patterning schemes, dielectric material fill without seems or voids in the patterned metal feature is a challenge. Also, the process window for forming a top contact structure is a challenge.

SUMMARY

A dielectric spacer is formed laterally adjacent to a bottom conductive structure. The dielectric spacer is configured to limit the area in which a subsequently formed top contact structure can contact the bottom conductive structure. In some embodiments, only a topmost surface of the bottom conductive structure is contacted by the top contact structure. In other embodiments, a topmost surface and an upper sidewall surface of the bottom conductive structure is contacted by the top contact structure.

In one aspect of the present application, a structure (interconnect or memory) is provided. In one embodiment of the present application, the structure includes a dielectric spacer located laterally adjacent to, and contacting, a sidewall of a bottom conductive structure. The bottom conductive structure can be a single bottom conductive structure or a dual bottom conductive structure that includes a lower bottom conductive structure and an upper bottom conductive structure. A top contact structure is located on at least a topmost surface of the bottom conductive structure and a surface of the dielectric spacer.

In another aspect of the present application, a method of forming a structure (interconnect or memory) is provided. In one embodiment of the present application, the method includes forming a dielectric spacer located laterally adjacent to, and contacting, a sidewall of a bottom conductive structure. The bottom conductive structure can be a single bottom conductive structure or a dual bottom conductive structure that includes a lower bottom conductive structure and an upper bottom conductive structure. Next, a dielectric material is formed laterally adjacent to, and above, the dielectric spacer, wherein the dielectric material is also present above the bottom conductive structure. A top contact structure is then formed in the dielectric material, wherein the top contact structure contacts at least a topmost surface of the bottom conductive structure and a surface of the dielectric spacer.

DETAILED DESCRIPTION

Figure 1B:
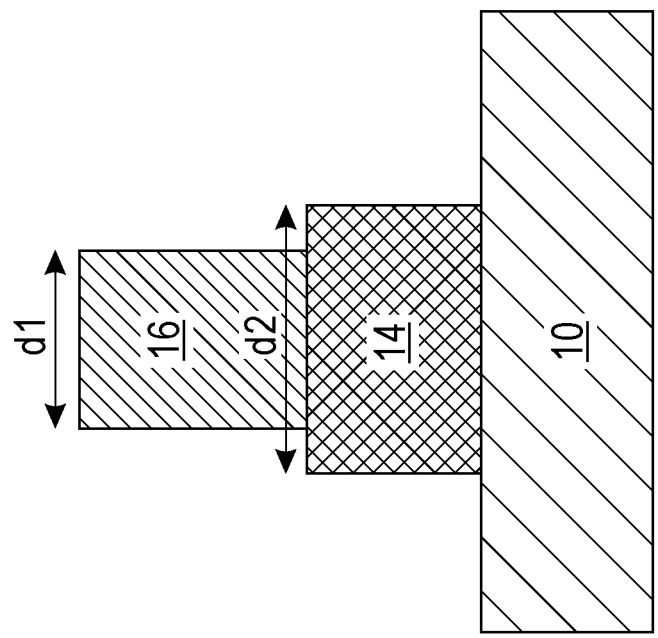
FIG. 1B is a cross sectional view of an exemplary structure that can be employed in accordance with another embodiment of the present application, wherein the exemplary structure includes a dual bottom conductive structure located on a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIGS. 1A, 1B, 1C and 1D, there are illustrated various structures that can be employed in accordance with different embodiments of the present application. Each structure includes a bottom conductive structure (single or dual) that can be formed utilizing a subtractive metal patterning process that includes deposition of a metal-containing layer (or layers) and patterning of the metal-containing layer (or layers) utilizing one or more etching processes.

Figure 1A:
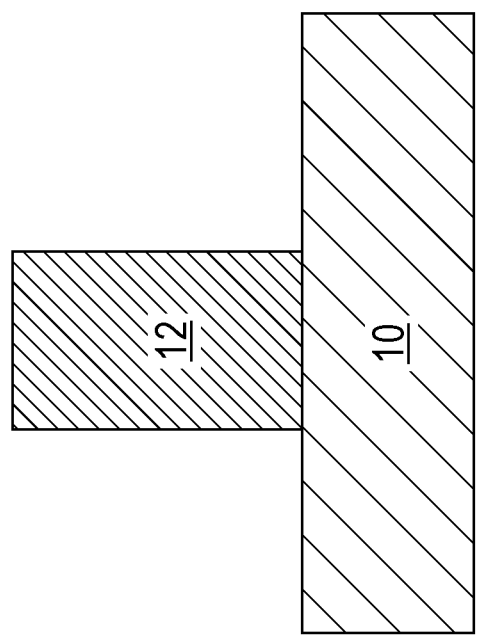
FIG. 1A is a cross sectional view of an exemplary structure that can be employed in accordance with an embodiment of the present application, wherein the exemplary structure includes a single bottom conductive structure located on a surface of a substrate.

In FIGS. 1A and 1B, the bottom conductive structure (single or dual) is formed on a substrate 10. Substrate 10 can be composed of a semiconductor material having semiconducting properties, an insulating material, a conductive material or any combination, including multilayers, thereof. In FIG. 1A, the bottom conductive structure is a single bottom conductive structure 12, while in FIG. 1B, the bottom conductive structure is a dual bottom conductive structure that includes a lower bottom conductive structure 14 and an upper bottom conductive structure 16. In some embodiments of the present application, the upper bottom conductive structure 16 has a first critical dimension, d1, and the lower bottom conductive structure 14 has a second critical dimension, d2, wherein the first critical dimension, d1, is less than, or equal to, the second critical dimension. In the present application, the critical dimension of the single bottom conductive structure 12 or the second critical dimension, d2, of the lower bottom conductive structure 14 can be less than, or equal to, the critical dimension of the underlying electrically conductive structure.

Figure 1D:
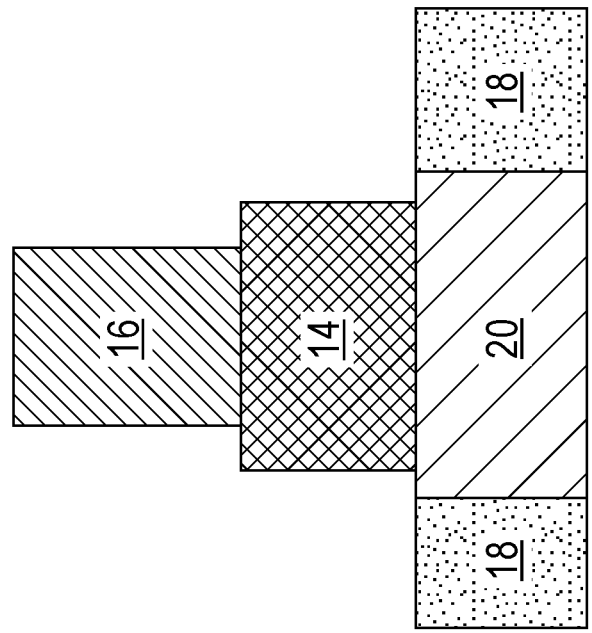
FIG. 1D is a cross sectional view of an exemplary structure that can be employed in accordance with a further embodiment of the present application, wherein the exemplary structure includes a dual bottom conductive structure located on a surface of an electrically conductive structure that is embedded in a dielectric material layer.
Figure 1C:
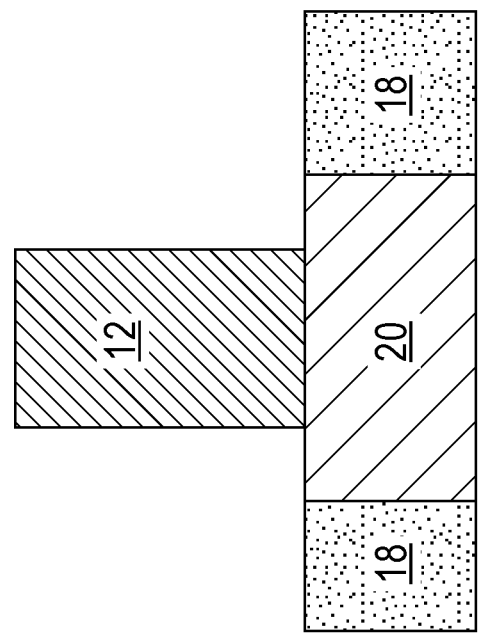
FIG. 1C is a cross sectional view of an exemplary structure that can be employed in accordance with yet another embodiment of the present application, wherein the exemplary structure includes a single bottom conductive structure located on a surface of an electrically conductive structure that is embedded in a dielectric material layer.

In FIGS. 1C and 1D, the bottom conductive structure (single or dual) is formed on a surface of an electrically conductive structure 20 that is embedded in a dielectric material layer 18. An optional diffusion barrier liner (not shown) can be located between the electrically conductive structure 20 and the dielectric material layer 18. In FIG. 2A, the bottom conductive structure is a single bottom conductive structure 12, while in FIG. 2B, the bottom conductive structure is a dual bottom conductive structure that includes a lower bottom conductive structure 14 and an upper bottom conductive structure 16. In some embodiments of the present application, the upper bottom conductive structure 16 has a first critical dimension, d1, and the lower bottom conductive structure 14 has a second critical dimension, d2, wherein the first critical dimension, d1, is less than, or equal to, the second critical dimension. In the present application, the critical dimension of the single bottom conductive structure 12 or the second critical dimension, d2, of the lower bottom conductive structure 14 can be less than, or equal to, the critical dimension of the underlying electrically conductive structure.

In some embodiments, the dielectric material layer 18 can be composed of an interlayer dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low k (less than 4.0) dielectric layer or any combination thereof. It is noted that all dielectric constant are measured in a vacuum unless otherwise noted herein.

In other embodiments, the dielectric material layer 18 can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Other dielectric materials besides interlayer and interconnect dielectric materials such as, for example, a dielectric capping layer can be used instead of, or together with, the interlayer dielectric material or the interconnect dielectric material.

The dielectric material layer 18 can be formed utilizing a deposition process such as, for example, chemical vapor deposition, plasma enhanced chemical vapor deposition or spin-on coating. The dielectric material layer 18 can have a thickness that is from 5 nm to 200 nm; although other thicknesses for the dielectric material layer 18 can be used in the present application.

In some embodiments, the electrically conductive structure 20 can be formed into the dielectric material layer 18 by first providing an opening into the dielectric material layer 18 and then filling the opening with an electrically conductive metal-containing material or materials that provide the electrically conductive structure 20. A planarization process can follow the deposition of the electrically conductive metal-containing material or materials that provide the electrically conductive structure 20. The planarization process removes all material or materials located outside the opening forming an electrically conductive structure 20 in the dielectric material layer 18. The opening that is formed into the dielectric material layer 18 can be formed by lithography and etching. Lithography includes forming a photoresist material (not shown) on a material or material stack that needs to be patterned. The photoresist material is then exposed to a pattern of irradiation, and thereafter the exposed photoresist material is developed utilizing a conventional resist developer. Etching can include a dry etching process and/or a wet etching process.

In some embodiments, a diffusion barrier material can be formed on the topmost surface of the dielectric material layer 18 and within the opening prior to forming electrically conductive metal-containing material or materials that provide the electrically conductive structure 20. The diffusion barrier material will provide the diffusion barrier liner mentioned above. The diffusion barrier material can include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material can have a thickness from 2 nm to 50 nm; although other thicknesses for the diffusion barrier material are contemplated and can be employed in the present application as long as the diffusion barrier material does not entirety fill the opening that is formed into the dielectric material layer 18. The diffusion barrier material can be formed by a deposition process including, for example, chemical vapor deposition, plasma enhanced chemical vapor deposition, atomic layer deposition, physical vapor deposition, sputtering, chemical solution deposition or plating.

In some embodiments, the electrically conductive structure 20 is formed first (by utilizing a subtractive metal patterning scheme, i.e., deposition and etching) and the dielectric material layer 18 is the formed laterally adjacent to the electrically conductive structure 20 (by deposition and an optional material removal process such as, for example, planarization or a recess etch).

The electrically conductive structure 20 that is employed in the present application is composed of at least one layer of an electrically conductive metal-containing material. In one embodiment, the at least electrically conductive structure 20 is composed of an electrically conductive metal, electrically conductive metal alloy or an electrically conductive metal nitride. Examples of electrically conductive metals that can be used to provide the electrically conductive structure 20 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to provide the electrically conductive structure 20 includes, but is not limited to, Cu—Al, and an example of electrically conductive metal nitride that can be used to provide the electrically conductive structure 20 includes, but is not limited to, TaN or TiN.

In another embodiment, the electrically conductive structure 20 is composed of a stack including one of the electrically conductive metals, metal alloys and/or metal nitrides as mentioned above.

In yet a further embodiment, the electrically conductive structure 20 is composed of a memory stack such as, for example, a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in one embodiment of the present application, the at least one metal-containing structure 18 can be an electrically conductive metal-containing material stack of a bottom electrode, a ferroelectric layer, and a top electrode. The bottom and top electrodes may be composed of a metal or metal nitride. For example, TiN may be used as the material for the bottom electrode and/or top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in one embodiment of the present application, electrically conductive structure 20 can be an electrically conductive metal-containing material stack of a bottom electrode, a ferroelectric layer, and a top electrode. The bottom and top electrodes may be composed of a metal or metal nitride. For example, TiN may be used as the material for the bottom and/or top electrode. The metal oxide may include oxides of nickel, zirconium, hafnium, iron, or copper.

A MRAM device is a random access memory that includes a magnetic tunnel junction (MTJ) structure. The magnetic tunnel junction (MTJ) structure may include a magnetic reference layer, a tunnel barrier, and a magnetic free layer. Thus, and in one embodiment of the present application, the electrically conductive structure 20 is a MTJ structure. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode. Thus, and in one embodiment of the present application, the electrically conductive structure 20 is an electrically conductive metal-containing material stack of a bottom electrode, a ferroelectric layer, and a top electrode. The bottom electrode and top electrode may be composed of a metal or metal nitride. For example, TiN may be used as the material for the bottom and/or top electrode. The phase change memory material may include a chalcogenide glass such as, for example, $Ge_2Sb_2Te_5$ or $Ge_2Bi_2Te_6$.

In some embodiments, the single bottom conductive structure 12 can be composed of at least one electrically conductive metal-containing material or a stack of electrically conductive metal-containing materials as mentioned above for the electrically conductive structure 20. In other embodiments, the single bottom conductive structure 12 is composed of elements of a ferroelectric memory (FE) stack, a resistive random access memory (ReRAM) stack, a magnetoresistive random access memory (MRAM) stack, or a phase change random access memory (PRAM) stack, as defined above for the electrically conductive structure 20. In one example, the single bottom conductive structure 12 is composed of one of the aforementioned memory stacks and the electrically conductive structure 20 is composed of Cu, Al or W.

In some embodiments, the lower bottom conductive structure 14 of the dual bottom conductive structure can be composed of at least one electrically conductive metal-containing material or a stack of electrically conductive metal-containing materials as mentioned above for the electrically conductive structure 20. In other embodiments, the lower bottom conductive structure 14 of the dual bottom conductive structure is composed of elements of a ferroelectric memory (FE) stack, a resistive random access memory (ReRAM) stack, a magnetoresistive random access memory (MRAM) stack, or a phase change random access memory (PRAM) stack, as defined above for the electrically conductive structure 20.

In some embodiments, the upper bottom conductive structure 16 of the dual bottom conductive structure can be composed of at least one electrically conductive metal-containing material or a stack of electrically conductive metal-containing materials as mentioned above for the electrically conductive structure 20. In other embodiments, the upper bottom conductive structure 16 of the dual bottom conductive structure is composed of elements of a ferroelectric memory (FE) stack, a resistive random access memory (ReRAM) stack, a magnetoresistive random access memory (MRAM) stack, or a phase change random access memory (PRAM) stack, as defined above for the electrically conductive structure 20.

In the present application, the electrically conductive structure 20 may be composed of materials that are the same as, or compositionally different from, the single bottom conductive structure 12. Also, and in the present application, the electrically conductive structure 20 may be composed of materials that are the same as, or compositionally different from, the lower bottom conductive structure 14 and/or the upper bottom conductive structure.

It is noted that in any of the embodiments mentioned above, more than one electrically conductive structure 20 and more than one bottom conductive structure (single or dual) can be formed. It is also noted that the electrically conductive materials that provide the electrically conductive structure 20 and the bottom conductive structure (single or dual) can be formed by a deposition process such as, for example, chemical vapor deposition, plasma enhanced chemical vapor deposition, sputtering, chemical solution deposition or plating.

Figure 2:
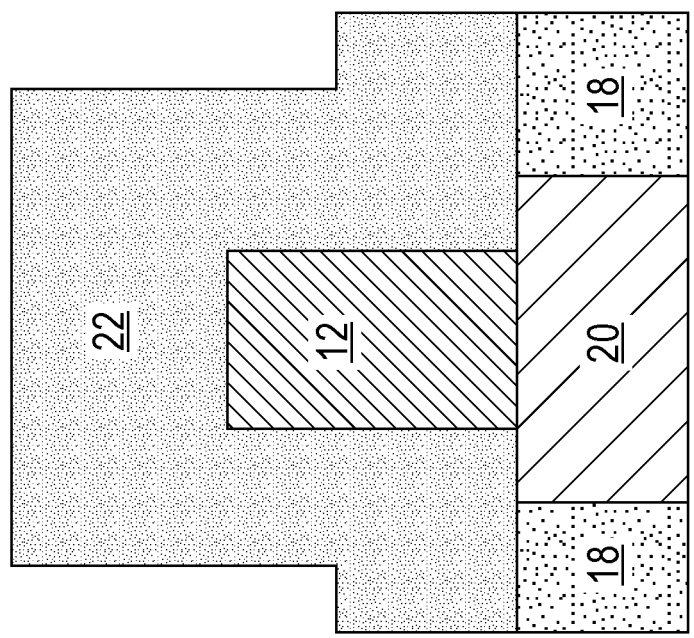
FIG. 2 is a cross sectional view of the exemplary structure of FIG. 1C after forming a dielectric spacer layer laterally adjacent to, and above, the single bottom conductive structure.

Referring now to FIG. 2, there is illustrated the exemplary structure of FIG. 1C after forming a dielectric spacer layer 22 laterally adjacent to, and above, the single bottom conductive structure 12. It is noted that the structures shown in FIGS. 1A, 1B and 1D can be subjected to dielectric spacer layer 22 formation, as well as processing steps of dielectric spacer formation and top contact formation to be subsequently described.

The dielectric spacer layer 22 can be composed of any dielectric spacer material including, for example, silicon dioxide, silicon nitride, silicon carbide or silicon oxynitride. The dielectric spacer material that provides the dielectric spacer layer 22 can be composed of a low k dielectric material (i.e., a dielectric material having a dielectric constant that is less than the dielectric constant of 4.0). An example of a low k dielectric material that can be used as the dielectric spacer layer 22 includes a dielectric material including atoms of silicon, carbon, nitrogen and hydrogen (i.e., SiC(N,H)).

The dielectric spacer layer 22 can be formed utilizing a deposition process such as, for example, chemical vapor deposition, plasma enhanced chemical vapor deposition or physical vapor deposition. The dielectric spacer layer 22 can have a thickness from 20 nm to 800 nm. Other thicknesses that are lesser than, or greater than, the aforementioned thickness range can also be employed in the present application as the thickness of the dielectric spacer layer 22. In some embodiments, the dielectric spacer layer 22 is a conformal layer. The term "conformal layer" denotes that a material layer has a vertical thickness along horizontal surfaces that is substantially the same (i.e., within ±5%) as the lateral thickness along vertical surfaces.

Figure 3:
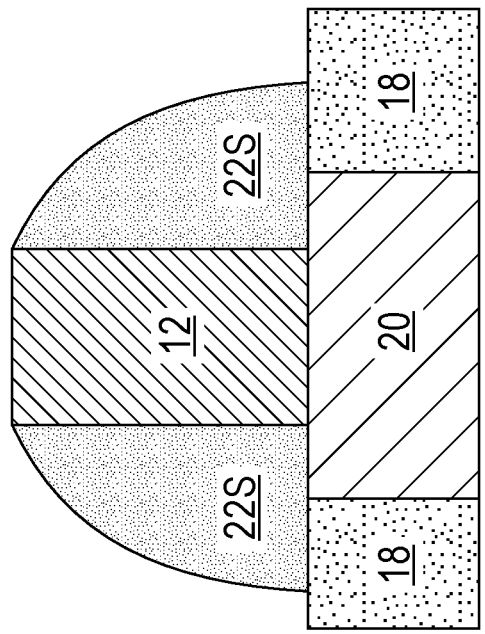
FIG. 3 is a cross sectional view of the exemplary structure of FIG. 2 after subjecting the dielectric spacer layer to a spacer etch which provides a dielectric spacer laterally adjacent to the single bottom conductive structure.

Referring now to FIG. 3, there is illustrated the exemplary structure of FIG. 2 after subjecting the dielectric spacer layer to a spacer etch which provides a dielectric spacer 22S located laterally adjacent to the single bottom conductive structure 12. In one embodiment of the present application, the spacer etch is a directional reactive ion etch (RIE). The dielectric spacer 22S encircles the single bottom conductive structure 12 and is present on a sidewall of the single bottom conductive structure 12.

In the illustrated embodiment shown in FIG. 3, the dielectric spacer 22S has a bottommost surface that is located on a portion of the electrically conductive structure 18 and a portion of the dielectric material layer 18 that embeds the electrically conductive structure 20. In other embodiments (see, for example, FIGS. 7A, 7B, 8A and 8B), the dielectric spacer 22S has a bottommost surface that is located on a portion of the substrate 10.

Figure 4:
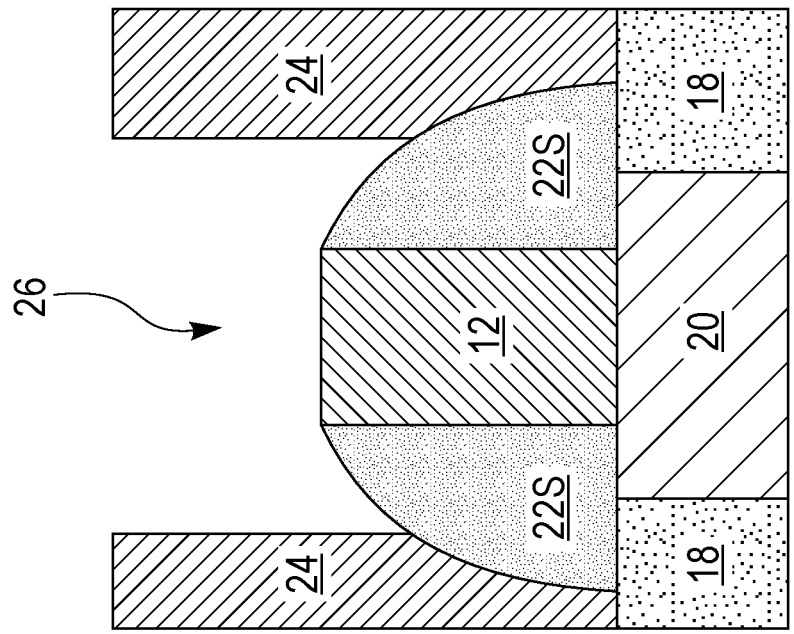
FIG. 4 is a cross sectional view of the exemplary structure of FIG. 3 after forming a dielectric material laterally adjacent to the dielectric spacer, and above the dielectric spacer and the single bottom conductive structure.

Referring now to FIG. 4, there is illustrated the exemplary structure of FIG. 3 after forming a dielectric material 24 laterally adjacent to the dielectric spacer 22S, and above the dielectric spacer 22S and the single bottom conductive structure 12.

The dielectric material 24 can be composed of one of the dielectric materials mentioned above for dielectric material layer 18 provided that the dielectric material 24 is compositionally different from the dielectric spacer 22S. The dielectric material 24 can be formed utilizing a deposition process such as, for example, chemical vapor deposition, plasma enhanced chemical vapor deposition or spin-on coating. The dielectric material 24 can have a thickness that is from 100 nm to 900 nm; although other thicknesses for the dielectric material 24 can be used as long as the dielectric material 24 covers the dielectric spacer 22S and the single bottom conductive structure 12. When a dual bottom conductive structure is used, the dielectric material 24 is sufficiently thick enough to cover the dielectric spacer 22S and the dual bottom conductive structure.

Figure 5:
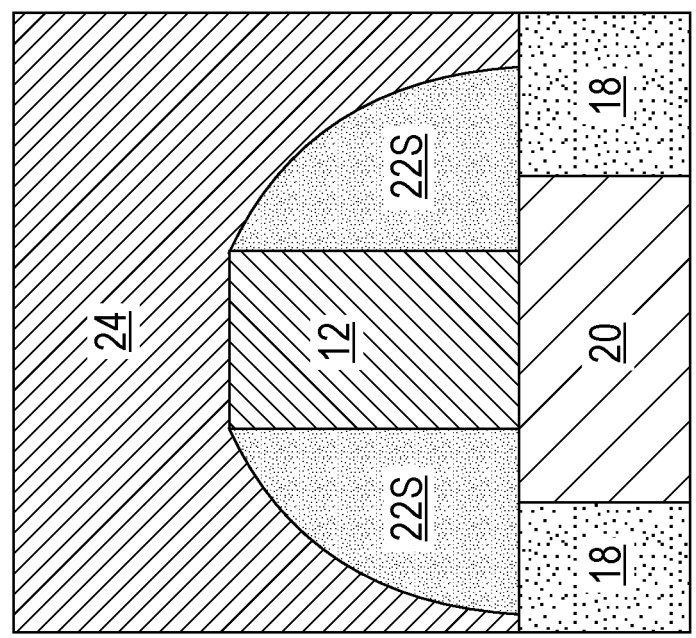
FIG. 5 is a cross sectional view of the exemplary structure of FIG. 4 after forming a contact opening in the dielectric material.

Referring now to FIG. 5, there is illustrated the exemplary structure of FIG. 4 after forming a contact opening 26 in the dielectric material 24. In illustrative embodiment shown in FIG. 5, the contact opening 26 physically exposes a portion of the single bottom conductive structure 12 and an upper portion of the dielectric spacer 22S. In the illustrated embodiment of FIG. 5, the contact opening 26 does not physical expose any portion of the sidewalls of the single bottom conductive structure 12. The contact opening 25 can be formed by lithography and etching.

In some embodiments of the present application (not shown in FIG. 5, but shown in FIGS. 6B, 7B, 8B and 9B), the formation of the contact opening 26 may recess the upper surface of the dielectric spacer 22S such that a small portion of the upper sidewall of the single bottom conductive structure 12 (or dual bottom conductive structure) is exposed; the recessed dielectric spacer is labeled as element 22S' in FIGS. 6B, 7B, 8B and 9B. In other embodiments, a recess etch may follow the formation of the contact opening 26 so as to provide the recessed dielectric spacer 22S'. In the present application, the small portion of the upper sidewall of the single bottom conductive structure 12 (or dual bottom conductive structure) that is exposed can be expressed as, d, wherein d is a distance from the topmost surface of the of the single bottom conductive structure 12 (or dual bottom conductive structure) to the topmost surface of the recessed dielectric spacer 22S'. In the present application, d is less than 10 nm, with from 1 nm to 8 nm being more typical.

Figure 6B:
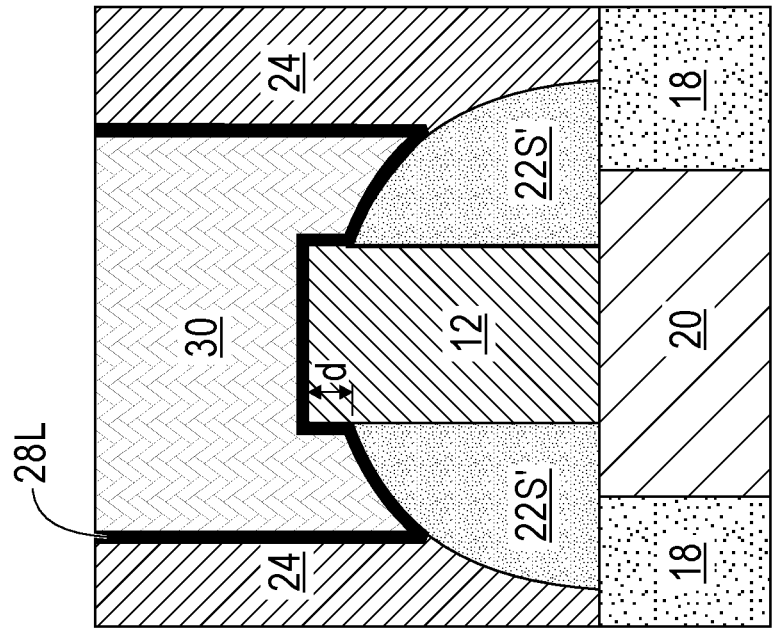
FIG. 6B is a cross sectional view of the exemplary structure of FIG. 5 after recessing a physically exposed portion of the dielectric spacer, and forming a top contact structure in the contact opening.
Figure 6A:
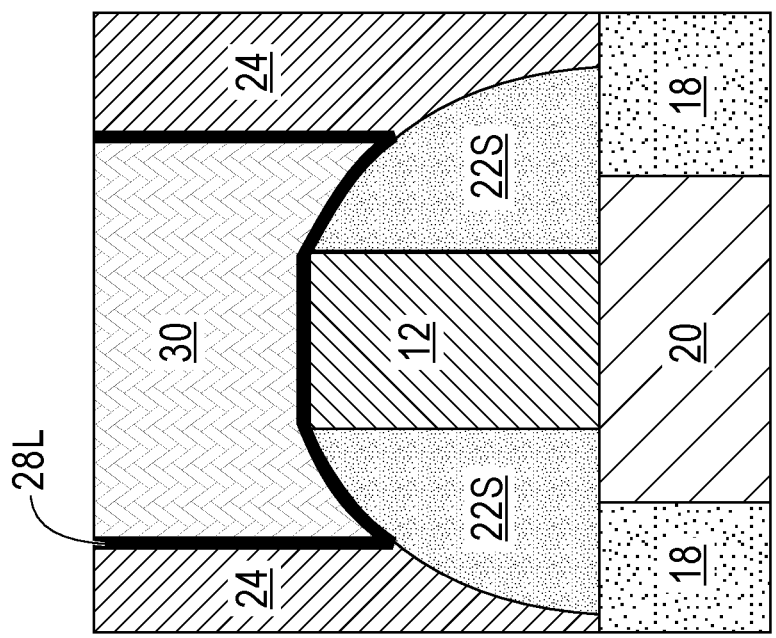
FIG. 6A is a cross sectional view of the exemplary structure of FIG. 5 after forming a top contact structure in the contact opening.

Referring now to FIG. 6A, there is illustrated the exemplary structure of FIG. 5 after forming a top contact structure 30 in the contact opening 26. In some embodiments, an optional diffusion barrier liner 28L is also formed in the contact opening 26. When present, the diffusion barrier liner 28L is located along the sidewalls and a bottom wall of the top contact structure 30.

The top contact structure 30 is composed of an electrically conductive material such as, for example an electrically conductive metal, an electrically conductive metal alloy or an electrically conductive metal nitride. Examples of electrically conductive metals that can be used to provide the top contact structure 30 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to provide the top contact structure 30 includes, but is not limited to, Cu—Al, and an example of electrically conductive metal nitride that can be used to provide the top contact structure 30 includes, but is not limited to, TaN or TiN. The top contact structure 30 can be composed of a single electrically conductive material or a multilayered stack of electrically conductive materials.

The optional diffusion barrier liner 28L can be composed of one of the diffusion barrier materials mentioned above that can be present along the sidewalls and the bottom wall of the electrically conductive structure 20 that is embedded in the dielectric material layer 18.

The exemplary structure shown in FIG. 6A can be formed by forming an electrically conductive metal-containing layer that includes one the electrically conductive materials mentioned above for the top contact structure 30 into the contact opening 26 and on topmost surface of the dielectric material 24. In some embodiments, a diffusion barrier material layer can be formed into the opening and on the topmost surface of the dielectric material 24. A planarization process such as, for example, chemical mechanical polishing and/or grinding can be used to remove the electrically conductive metal-containing layer and, if present, the diffusion barrier material layer that is present outside of the contact opening 26 and on the topmost surface of the dielectric material, while maintaining the electrically conductive metal-containing layer and, if present, the diffusion barrier material layer within the contact opening 26. The electrically conductive metal-containing layer that is maintained in the contact opening 26 defines the top contact structure 30, while the diffusion barrier material layer that is maintained in the opening defines a diffusion barrier liner 28L that is located along the sidewalls and bottom wall of the top contact structure 30.

As is shown in FIG. 6A, the top contact structure 30 has a topmost surface that is coplanar with a topmost surface of both the optional diffusion barrier liner 28L and the dielectric material 24. As is also shown, the top contact structure 30 of this embodiment contacts a topmost surface of the single bottom conductive structure 12 as well as an upper surface of the dielectric spacer 22S; the top contact structure 30 does not, however, contact any portion of the sidewall of the single bottom conductive structure 12 due to the presence of the dielectric spacer 22S.

Referring now to FIG. 6B, there is illustrated the exemplary structure of FIG. 5 after recessing a physically exposed portion of the dielectric spacer 22S, and forming a top contact structure 30 in the contact opening 26. An optional diffusion barrier liner 28L can be formed in the contact opening 26 as well. As mentioned above, the recessing of the dielectric spacer 22S can occur during the formation of the contact opening 26 or by utilizing a separate recess etching process that follows the formation of the contact opening.

The top contact structure 30 and optional diffusion barrier liner 28L of this embodiment include materials as defined above for providing the structure shown in FIG. 6A. The top contact structure 30 and optional diffusion barrier liner 28L of this embodiment can be formed utilizing the processes steps mentioned above for providing the structure shown in FIG. 6A.

As is shown in FIG. 6B, the top contact structure 30 has a topmost surface that is coplanar with a topmost surface of both the optional diffusion barrier liner 28L and the dielectric material 24. As is also shown, the top contact structure 30 of this embodiment contacts a topmost surface of the single bottom conductive structure 12, upper portion, defined by d (as mentioned above), of the sidewall of the single bottom conductive structure 12, and an upper surface of the recessed dielectric spacer 22S'.

Figure 7B:
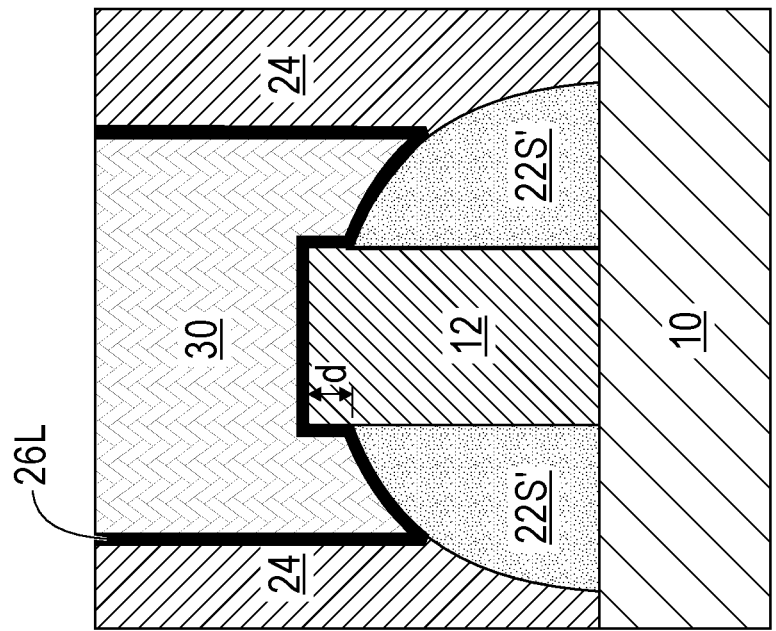
FIG. 7B is a cross sectional view of the exemplary structure of FIG. 1A after recessing a physically exposed portion of the dielectric spacer, and forming a top contact structure in the contact opening.
Figure 7A:
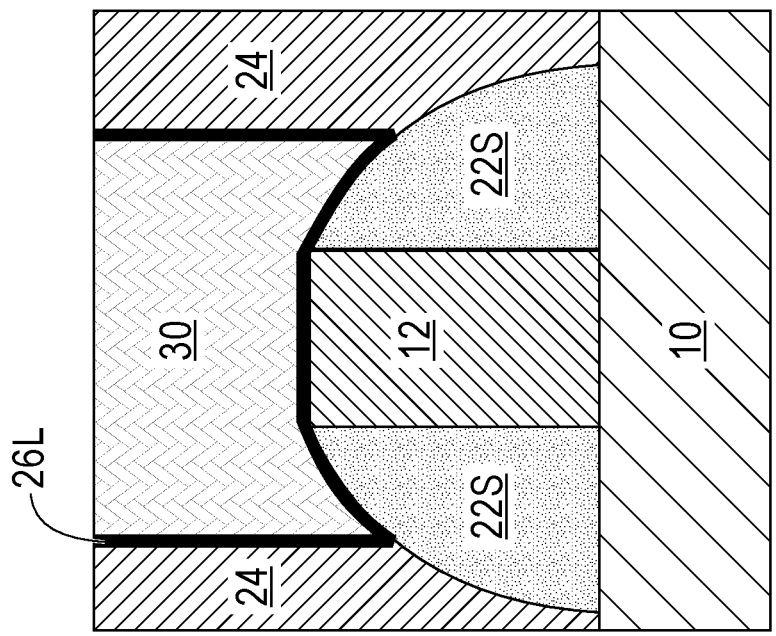
FIG. 7A is a cross sectional view of the exemplary structure of FIG. 1A after dielectric spacer and top contact structure formation.

Referring now to FIG. 7A, there is illustrated the exemplary structure of FIG. 1A after dielectric spacer 22S and top contact structure 30 formation. The exemplary structure shown in FIG. 7A can be formed utilizing the various materials and processing steps mentioned above in forming the exemplary structure shown in FIG. 6A.

Referring now to FIG. 7B, there is illustrated the exemplary structure of FIG. 1A after recessing the dielectric spacer 22S (to provided recessed dielectric spacer 22S') and top contact structure 30 formation. The exemplary structure shown in FIG. 7B can be formed utilizing the various materials and processing steps mentioned above in forming the exemplary structure shown in FIG. 6B.

Figure 8B:
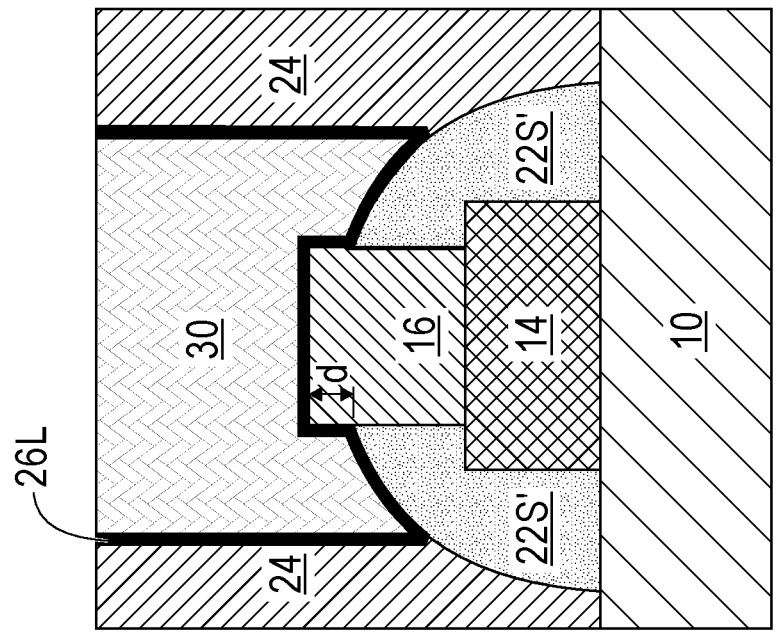
FIG. 8B is a cross sectional view of the exemplary structure of FIG. 1B after recessing a physically exposed portion of the dielectric spacer, and forming a top contact structure in the contact opening.
Figure 8A:
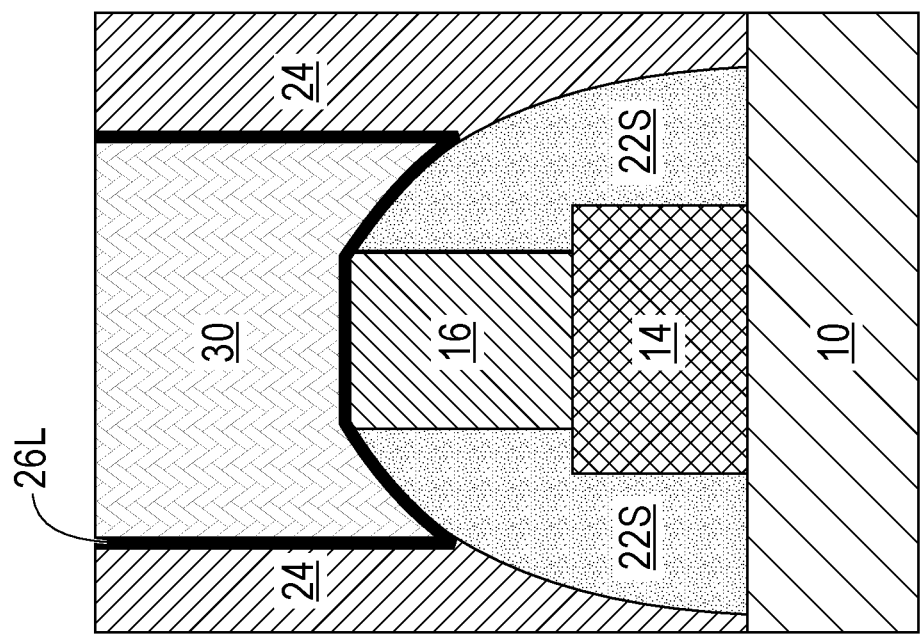
FIG. 8A is a cross sectional view of the exemplary structure of FIG. 1B after dielectric spacer and top contact structure formation.

Referring now to FIG. 8A, there is illustrated the exemplary structure of FIG. 1B after dielectric spacer 22S and top contact structure 30 formation. The exemplary structure shown in FIG. 8A can be formed utilizing the various materials and processing steps mentioned above in forming the exemplary structure shown in FIG. 6A.

Referring now to FIG. 8B, there is shown the exemplary structure of FIG. 1B after recessing the dielectric spacer 22S (to provided recessed dielectric spacer 22S') and top contact structure 30 formation. The exemplary structure shown in FIG. 8B can be formed utilizing the various materials and processing steps mentioned above in forming the exemplary structure shown in FIG. 6B.

Figure 9B:
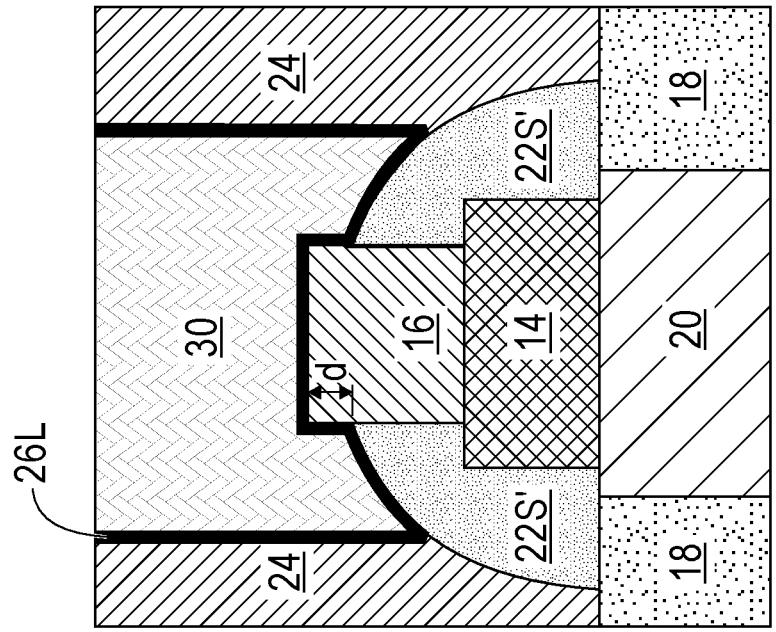
FIG. 9B is a cross sectional view of the exemplary structure of FIG. 1D after recessing a physically exposed portion of the dielectric spacer, and forming a top contact structure in the contact opening.
Figure 9A:
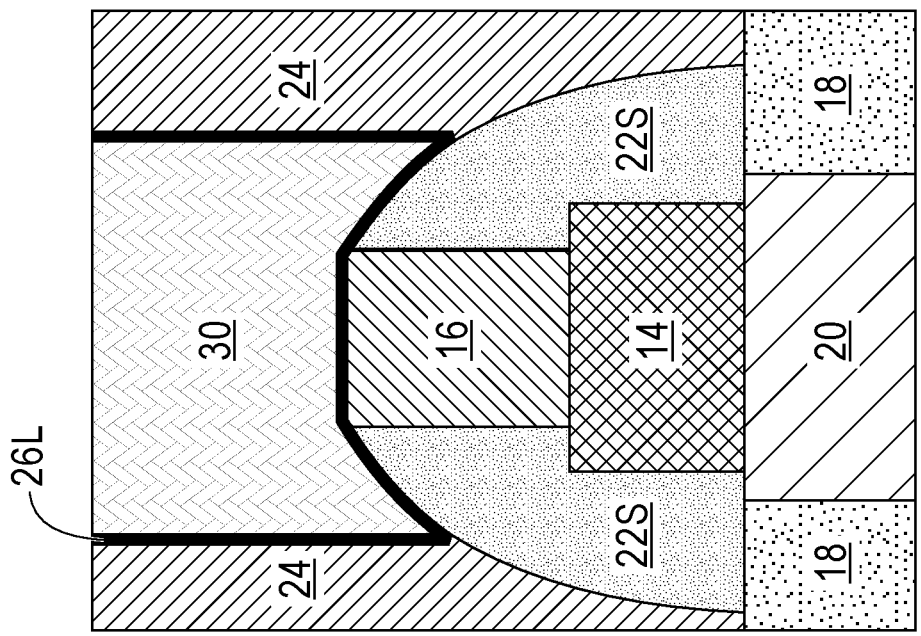
FIG. 9A is a cross sectional view of the exemplary structure of FIG. 1D after dielectric spacer and top contact structure formation.

Referring now to FIG. 9A, there is illustrated the exemplary structure of FIG. 1D after dielectric spacer 22S and top contact structure 30 formation. The exemplary structure shown in FIG. 9A can be formed utilizing the various materials and processing steps mentioned above in forming the exemplary structure shown in FIG. 6A.

Referring now to FIG. 9B, there is illustrated the exemplary structure of FIG. 1D after recessing the dielectric spacer 22S (to provided recessed dielectric spacer 22S') and top contact structure 30 formation. The exemplary structure shown in FIG. 9B can be formed utilizing the various materials and processing steps mentioned above in forming the exemplary structure shown in FIG. 6B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
a dielectric spacer located laterally adjacent to, and contacting, a sidewall of a bottom conductive structure;
a layer of dielectric material located laterally adjacent to, and above, the dielectric spacer; and
a top contact structure located on at least a topmost surface of the bottom conductive structure and a surface of the dielectric spacer, wherein the top contact structure is embedded in the layer of dielectric material.

2. The structure of claim 1, wherein the bottom conductive structure is located on a surface of a substrate.

3. The structure of claim 2, wherein the bottom conductive structure includes a single bottom conductive structure.

4. The structure of claim 2, wherein the bottom conductive structure is a dual bottom conductive structure including a lower bottom conductive structure and an upper bottom conductive structure.

5. The structure of claim 4, wherein the upper bottom conductive structure has a first critical dimension and the lower bottom conductive structure has a second critical dimension, wherein the first critical dimension is less than, or equal to, the second critical dimension.

6. The structure of claim 1, wherein the bottom conductive structure is located on a surface of an electrically conductive structure that is embedded in a lower dielectric material layer.

7. The structure of claim 6, wherein the bottom conductive structure includes a single bottom conductive structure.

8. The structure of claim 6, wherein the bottom conductive structure is a dual bottom conductive structure including a lower bottom conductive structure and an upper bottom conductive structure.

9. The structure of claim 8, wherein the upper bottom conductive structure has a first critical dimension and the lower bottom conductive structure has a second critical dimension, wherein the first critical dimension is less than, or equal to, the second critical dimension.

10. The structure of claim 1, wherein the surface of the dielectric spacer that the top contact structure is present on is recessed, and wherein the top contact structure contacts an uppermost sidewall surface of the bottom conductive structure.

11. The structure of claim 1, wherein the bottom conductive structure is composed of at least one electrically conductive metal-containing material or a stack of electrically conductive metal-containing materials.

12. The structure of claim 1, wherein the bottom conductive structure is composed of elements of a ferroelectric memory (FE) stack, a resistive random access memory (ReRAM) stack, a magnetoresistive random access memory (MRAM) stack, or a phase change random access memory (PRAM) stack.

13. The structure of claim 1, wherein the top contact structure has a topmost surface that is coplanar with a topmost surface of the layer of dielectric material.

14. A method of forming a semiconductor structure, the method comprising:
forming a dielectric spacer located laterally adjacent to, and contacting, a sidewall of a bottom conductive structure;
forming a layer of dielectric material laterally adjacent to, and above, the dielectric spacer, wherein the layer of dielectric material is also present above the bottom conductive structure;
forming a contact opening in the layer of dielectric material; and
forming a top contact structure in the contact opening formed in the layer of dielectric material, wherein the top contact structure contacts at least a topmost surface of the bottom conductive structure and a surface of the dielectric spacer.

15. The method of claim 14, wherein the bottom conductive structure is located on a surface of a substrate or on a surface of an electrically conductive structure that is embedded in a lower dielectric material layer.

16. The method of claim 14, wherein the bottom conductive structure includes a single bottom conductive structure.

17. The method of claim 14, wherein the bottom conductive structure is a dual bottom conductive structure including a lower bottom conductive structure and an upper bottom conductive structure.

18. The method of claim 17, wherein the upper bottom conductive structure has a first critical dimension and the lower bottom conductive structure has a second critical dimension, wherein the first critical dimension is less than, or equal to, the second critical dimension.

19. The method of claim 14, wherein the dielectric spacer is recessed prior to forming the top contact structure in the contact opening present in the layer of dielectric material to physically expose an upper sidewall portion of the bottom conductive structure.

20. The method of claim 14, wherein the bottom conductive structure is formed utilizing a subtractive etch process.

* * * * *